(12) United States Patent
Zheng et al.

(10) Patent No.: US 11,525,868 B2
(45) Date of Patent: Dec. 13, 2022

(54) TERMINAL OF SUPPORTING LEAKAGE DETECTION, AND METHOD FOR PERFORMING LEAKAGE DETECTION FOR THE TERMINAL

(71) Applicant: SAMSUNG ELECTRONICS CO., LTD., Suwon-si (KR)

(72) Inventors: Jicheng Zheng, Guangdong (CN); Jiayi Yang, Guangdong (CN); Jintao Li, Guangdong (CN); Songmin Jin, Guangdong (CN); Wenjie Zou, Guangdong (CN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 16/978,902

(22) PCT Filed: Nov. 20, 2018

(86) PCT No.: PCT/KR2018/014291
§ 371 (c)(1),
(2) Date: Sep. 8, 2020

(87) PCT Pub. No.: WO2020/105745
PCT Pub. Date: May 28, 2020

(65) Prior Publication Data
US 2021/0048483 A1    Feb. 18, 2021

(51) Int. Cl.
*G01R 31/52* (2020.01)
*G01R 31/56* (2020.01)

(52) U.S. Cl.
CPC ............. *G01R 31/52* (2020.01); *G01R 31/56* (2020.01)

(58) Field of Classification Search
CPC ......... G01R 31/52; G01R 31/50; G01R 31/56
See application file for complete search history.

(56) References Cited

U.S. PATENT DOCUMENTS 4,477,768 A * 10/1984 Hiramoto ............... G01R 27/18
324/510
6,011,398 A * 1/2000 Bald ...................... G01R 31/50
324/511

(Continued)

FOREIGN PATENT DOCUMENTS

CA         2597060 A1 * 8/2006 ......... G01R 31/3277
CN      104267251 A      1/2015
(Continued)

OTHER PUBLICATIONS

International Search Report (PCT/ISA/210), issued by International Searching Authority in corresponding International Application No. PCT/KR2018/014291, dated Aug. 19, 2019.
(Continued)

*Primary Examiner* — Patrick Assouad
*Assistant Examiner* — Demetrius R Pretlow
(74) *Attorney, Agent, or Firm* — Sughrue Mion, PLLC

(57) ABSTRACT

A terminal supporting leakage detection and a detection method for performing leakage detection for the terminal is provided, the terminal may include: a first conductive unit, a second conductive unit, a first access end, and a second access end, wherein the first access end is configured to be connected to a ground line of a main board of the terminal through the first conductive unit and used to access a ground line of an external leakage detection apparatus, and the second access end is configured to be connected inside the terminal to a metal portion of a outer casing of the terminal through the second conductive unit and used to access a leakage test line of the leakage detection apparatus.

18 Claims, 12 Drawing Sheets

(56) References Cited

U.S. PATENT DOCUMENTS

| | | | | |
|---|---|---|---|---|
| 6,633,169 | B1 * | 10/2003 | Cavigelli | G01R 31/52 324/551 |
| 9,903,901 | B2 * | 2/2018 | Jeon | G11C 29/023 |
| 2009/0085576 | A1 * | 4/2009 | Lenzie | H02H 3/16 324/510 |
| 2009/0287430 | A1 * | 11/2009 | Atoji | G01R 31/52 702/58 |
| 2013/0169286 | A1 * | 7/2013 | Phillips | G01R 31/1245 324/509 |
| 2014/0352405 | A1 * | 12/2014 | Motomura | G01N 27/68 73/23.31 |
| 2015/0349517 | A1 * | 12/2015 | Li | H02H 3/16 361/42 |
| 2015/0362543 | A1 * | 12/2015 | Gale | G01R 31/006 324/503 |
| 2017/0363672 | A1 * | 12/2017 | Kim | G01R 31/52 |
| 2019/0260290 | A1 * | 8/2019 | Maejima | G01R 31/52 |
| 2021/0341547 | A1 * | 11/2021 | Bagga | G01R 31/083 |

FOREIGN PATENT DOCUMENTS

| | | | | | |
|---|---|---|---|---|---|
| CN | 204925229 | U | | 12/2015 | |
| CN | 107499153 | A | * | 12/2017 | ......... G01R 31/3277 |
| CN | 107677878 | A | * | 2/2018 | |
| CN | 107677878 | A | | 2/2018 | |
| CN | 109149515 | A | * | 1/2019 | ............... G01R 1/18 |
| CN | 112864869 | A | * | 5/2021 | ............. G01R 31/14 |
| EP | 0488908 | A1 | * | 6/1992 | ............... G01R 1/18 |
| JP | H08-122389 | A | | 5/1996 | |
| JP | 2008-096106 | A | | 4/2008 | |
| KR | 20200006776 | A | * | 1/2020 | |

OTHER PUBLICATIONS

Written Opinion (PCT/ISA/237) issued by the International Searching Authority in corresponding International Application No. PCT/KR2018/014291, dated Aug. 19, 2019.

* cited by examiner

TERMINAL OF SUPPORTING LEAKAGE DETECTION, AND METHOD FOR PERFORMING LEAKAGE DETECTION FOR THE TERMINAL

CROSS-REFERENCES TO RELATED APPLICATIONS

This application is a National Stage Entry of PCT International Application No. PCT/KR2018/014291, which was filed on Nov. 20, 2018, the disclosure of which is incorporated herein by reference.

BACKGROUND

1. Field

The present application relates to a leakage detection technology for a terminal, and more particularly to a terminal that supports leakage detection after the terminal is assembled and a detection method for performing leakage detection for the terminal.

2. Description of Related Art

In the art, there may be leakage between an external metal and an internal main board of the metal terminal after a metal terminal completes a finished product assembly, and in this case, if a user connects non-standard power lines, chargers or serial ports to the metal terminal, since there may also be leakages in these non-standard power line, charger or serial ports themselves, a leakage current of these non-standard power lines, chargers or serial ports may be transmitted to an external metal area of the metal terminal through a leakage path between the internal main board of the metal terminal and the external metal of the metal terminal, and if the user touches an area of the external metal of the metal terminal at this time, the leakage current may cause personal injury. For example, as shown in FIG. 1, if a charger connected to an external interface or an associated connection line leaks, a leakage current can flow into the metal terminal through the external interface, and at this time, if there is also leakage between a ground line GND inside the metal terminal and a external metal of a external edge of the metal terminal, the leakage current flowing into the metal terminal will cause injury to a user touching the external metal.

Therefore, for the sake of safety, the metal terminal needs to be tested for leakage after the metal terminal is assembled into a finished product. For example, as shown in FIG. 2, a ground line GND 21 of a leakage detection apparatus 20 is connected to the ground line GND inside the metal terminal through an external interface 23 of the metal terminal while a leakage test line 22 of the leakage detection apparatus 20 is connected to the external metal of the metal terminal, thereby realizing leakage detection. When performing the leakage detection, if the external metal of the metal terminal has no insulating coating, the leakage test line 22 may be directly connected to the external metal of the metal terminal to realize the leakage detection.

However, in reality, in order to ensure a beautiful appearance of the metal terminal with metal materials, the external metal of the metal terminal is often subjected to color covering and spraying, for example, painting or anodizing or the like, which causes the external metal to be in an insulated state, thereby causing that there is no exposed test point for leakage test outside the metal terminal. In this regard, in the prior art, it is necessary to scrape the coating of the external metal or to leave out partial region during the color covering and spraying so as to connect the leakage test line of the leakage detection apparatus to the exposed test point of the metal terminal, thereby confirming whether there is leakage between the internal main board and the external metal of the metal terminal when the metal terminal is in a finished product state.

SUMMARY

The purpose of the exemplary embodiment of the present invention is to provide a terminal capable of supporting leakage detection after the terminal is assembled and a detection method for performing leakage detection for the terminal.

According to an aspect of the present invention, a terminal supporting leakage detection is provided, and the terminal may include: a first conductive unit, a second conductive unit, a first access end, and a second access end, wherein the first access end is configured to be connected to a ground line of a main board of the terminal through the first conductive unit and used to access a ground line of an external leakage detection apparatus, and the second access end is configured to be connected inside the terminal to a metal portion of a outer casing of the terminal through the second conductive unit and used to access the leakage test line of the leakage detection apparatus.

The first access end and the second access end may be pins of an external interface of the terminal.

The first access end may be a pin of an external interface of the terminal, and the second access end may be an access end that can be connected through an insertion hole of the terminal.

The first conductive unit may be a wire, and the second conductive unit may include a wire and a metal dome or a conductive foam, wherein the second access end may be connected to the metal portion by the metal dome or the conductive foam.

The terminal may further include: a switching unit configured to be connected to the second access end and the metal portion, and to connect the second access end and the metal portion or disconnect the second access end from the metal portion.

The terminal may further include: a third conductive unit; a third access end configured to be connected to the switching unit of the terminal through the third conductive unit, and used to access a control signal line of the leakage detection apparatus, wherein the switching unit connects the second access end and the metal portion or disconnects the second access end from the metal portion according to a control signal received from the third access end.

When the metal portion includes a plurality of metal portions that are insulated and separated from each other, the switching unit may connect at least one of the plurality of metal portions to the second access end according to a received control signal, so that the leakage detection apparatus determines whether a leakage current is detected from the second access end of the terminal with respect to a specified metal portion of the plurality of metal portions.

The terminal may further include: a control unit connected to the switching unit and the third access end through the third conductive unit and used to control the switching unit to connect the second access end and the metal portion or disconnect the second access end from the metal portion according to the control signal received from the leakage detection apparatus by the third access end.

The third conductive unit may be a wire, and the third access end may be a pin of an external interface of the terminal.

According to another aspect of the present invention, a detection method for performing leakage detection for a terminal supporting leakage detection is provided, and the detection method may include: inputting a test current to a first access end of the terminal by a leakage detection apparatus; determining whether a leakage current is detected from a second access end of the terminal, by the leakage detection apparatus, wherein the first access end of the terminal is connected to a ground line of a main board of the terminal through a first conductive unit of the terminal and externally connected to a ground line of the leakage detection apparatus, and the second access end of the terminal is connected inside the terminal to a metal portion of a outer casing of the terminal through a second conductive unit of the terminal and externally connected to a leakage test line of the leakage detection apparatus.

The first access end and the second access end may be pins of an external interface of the terminal.

The first access end may be a pin of an external interface of the terminal, and the second access end may be an access end that can be connected through an insertion hole of the terminal.

The first conductive unit may be a wire, and the second conductive unit may include a wire and a metal dome or a conductive foam, wherein the second access end may be connected to the metal portion by the metal dome or the conductive foam.

The method may further include: connecting the second access end and the metal portion by a switching unit of the terminal, wherein the switching unit is connected to the second access end and the metal portion.

The connecting the second access end and the metal portion by the switching unit of the terminal may include: connecting the second access end and the metal portion according to a control signal received from a third access end of the terminal, by the switching unit, wherein the third access end is connected to the switching unit through a third conductive unit and externally connected to a control signal line of the leakage detection apparatus.

The connecting the second access end and the metal portion by the switching unit of the terminal may include: when the metal portion includes a plurality of metal portions that are insulated and separated from each other, connecting at least one of the plurality of metal portions to the second access end according to a received control signal by the switching unit, so that the leakage detection apparatus determines whether the leakage current is detected from the second access end of the terminal with respect to a specified metal portion of the plurality of metal portions.

The connecting the second access end and the metal portion according to the control signal received from the third access end of the terminal, by the switching unit may include: receiving the control signal from the leakage detection apparatus by a control unit of the terminal through the third access end of the terminal; controlling the switching unit to connect the second access end and the metal portion according to the received control signal by the control unit of the terminal, wherein the control unit is connected to the switching unit and the third access end by the third conductive unit.

The third conductive unit may be a wire, and the third access end may be a pin of an external interface of the terminal.

BRIEF DESCRIPTION OF THE DRAWINGS

The above and other purposes and features of the exemplary embodiments of the present invention will become more apparent by the following description in connection with the accompanying drawings that schematically illustrates the embodiments, wherein.

DETAILED DESCRIPTION

Figure 1:
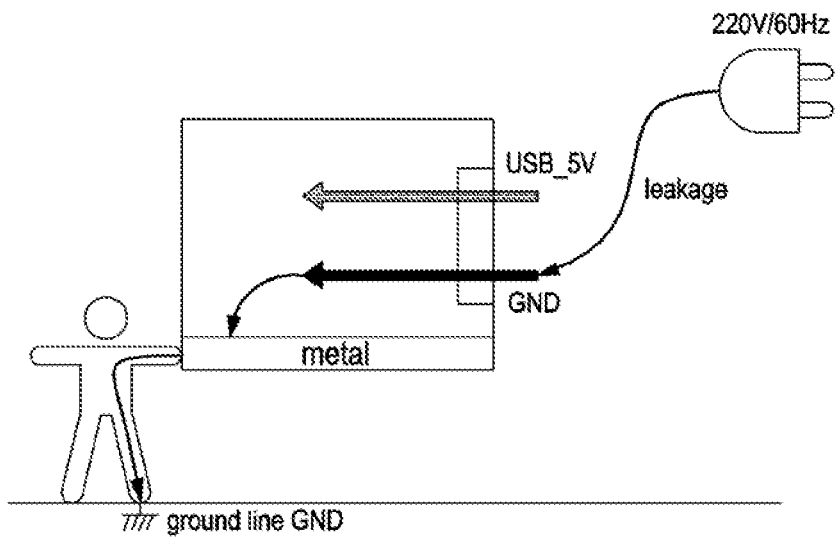
FIG. 1 is a schematic diagram illustrating a leakage generating procedure.
Figure 2:
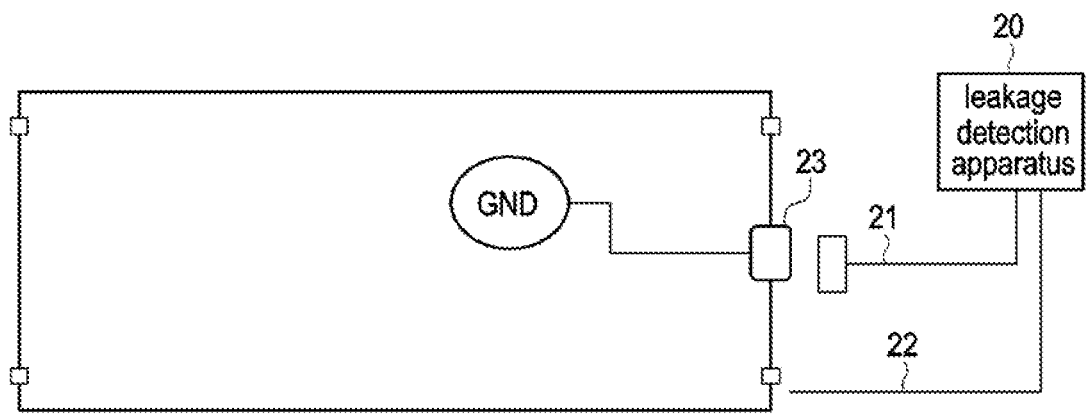
FIG. 2 is a schematic diagram illustrating a leakage detection technology in the related art.

Exemplary embodiments of the present invention will be described in detail below with reference to the drawings in which the same reference numerals always refer to the same part.

Figure 3:
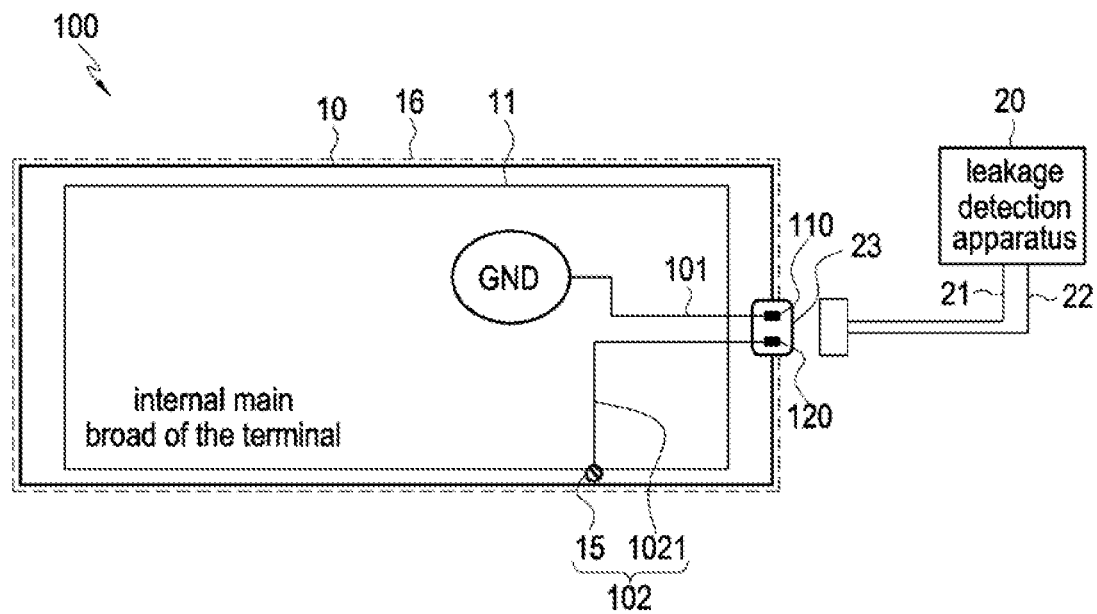
FIG. 3 is a diagram illustrating a configuration of a terminal supporting leakage detection according to an exemplary embodiment of the present invention.

FIG. 3 is a diagram illustrating a configuration of a terminal 100 supporting leakage detection according to an exemplary embodiment of the present invention.

As shown in FIG. 3, a metal portion 10 (i.e., a external metal) of a outer casing of the terminal 100 whose appearance is covered and sprayed (i.e., a insulating layer 16 is formed, as shown by a outer dotted line of the terminal 100) is a continuous whole, i.e., the outer casing of the terminal 100 has a continuous metal portion 10. The terminal 100 may include a first conductive unit 101, a second conductive unit 102, a first access end 110, and a second access end 120, wherein the first access end 110 may be configured to be connected to a ground line GND of a main board 11 of the terminal 100 through the first conductive unit 101, and used to access a ground line GND 21 of a external leakage detection apparatus 20, and the second access end 120 may be configured to be connected inside the terminal 100 to the metal portion 10 of the outer casing of the terminal 100 through the second conductive unit 102 and used to access a leakage test line 22 of a external leakage detection apparatus 20. The leakage detection apparatus 20 may detect whether there is leakage in the metal portion 10 of the terminal 100 by utilizing the first access end 110 and the second access end 120 of the terminal 100, i.e., detecting whether there is leakage between the metal portion 10 of the terminal 100 and the ground line GND of the terminal 100.

In this embodiment, the first access end 110 and the second access end 120 may be pins of an external interface 23 of the terminal 100, wherein the external interface 23 may be any external interface such as an universal serial bus (USB) interface, a serial port or the like, capable of exposing an internal wire of the terminal 100 to the outside through pins so as to be used by an external device to interact with the terminal 100. In specifically, the first access end 110 may be a pin connected to the ground line GND on the main board 11 of the terminal 100 through the first conductive unit 101 inside the terminal 100, wherein the first conductive unit 101 may be any conductive units, such as a metal wire, capable of electrically connecting the first access end 110 and the ground line GND on the main board 11.

The second access end 120 may be implemented via a reserved pin that is not used in the external interface 23, and the reserved pin may be connected to the metal portion 10 inside the terminal 100 through the second conductive unit 102, wherein the second conductive unit 102 may be any conductive units capable of electrically connecting the second access end 120 to the metal portion 10. As a preferred embodiment, the second conductive unit 102 may be a conductive unit composed of a metal wire in the main board 11 (or a small main board) and a dome or a conductive foam 15 on the main board 11 (or a small main board), wherein the dome or the conductive foam 15 may be connected to the metal portion 10 inside the terminal 100 after the finished product assembly for the terminal 100 is completed, thereby the second conductive unit 102 is connected to the metal portion 10 through the dome or the conductive foam 15.

Figure 4:
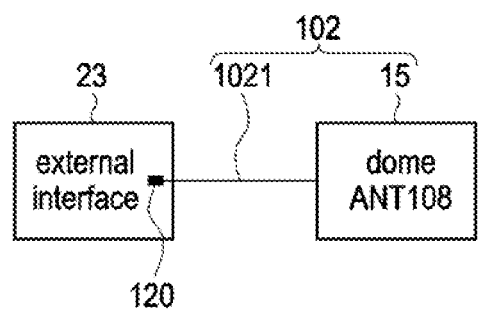
FIG. 4 is a schematic diagram illustrating a configuration of a terminal supporting leakage detection by utilizing an universal serial bus (USB) interface according to an exemplary embodiment of the present invention.

For example, when the external interface 23 is a USB interface, the first access end 110 may be a GND pin that exists in the USB interface, wherein the GND pin is connected to the ground line GND on the main board 11 through the first conductive unit 101; the second access end 120 may be one unused pin existing in the USB interface, and when the finished product assembly for the terminal 100 is completed, this pin may be finally connected inside the terminal 100 to the metal portion 10 through the second conductive unit 102, wherein as shown in FIG. 4, the second conductive unit 102 may include a metal dome ANT-108 15 and a wire 1021, wherein the metal dome ANT 108 15 has a certain compression ratio, and the metal dome ANT 108 15 is finally connected to the metal portion 10 inside the terminal 100 when the finished product assembly for the terminal 100 is completed.

In this case, the leakage detection apparatus 20 may be connected through its external interface to the external interface 23 of the terminal 100, that is, the first access end 110 and the second access end 120 included in the external interface 23 of the terminal 100 may respectively access the ground line GND 21 and the leakage test line 22 of the leakage detection apparatus 20. After the above connection, the leakage detection apparatus 20 may input a test current to the first access end 110 of the terminal 100 through the ground line GND 21, and then the leakage detection apparatus 20 may determine whether a leakage current is detected from the second access end of the terminal 100, through the leakage test line 22. If the leakage detection apparatus 20 has determined that the leakage current is detected from the second access end 120 of the terminal 100, it may be determined that there is leakage between the ground line GND and the metal portion 10 of the terminal 100. If the leakage detection apparatus 20 has determined that a leakage current is not detected from the second access end 120 of the terminal 100, it may be determined that there is no leakage between the ground line GND and the metal portion 10 of the terminal 100.

Figure 5:
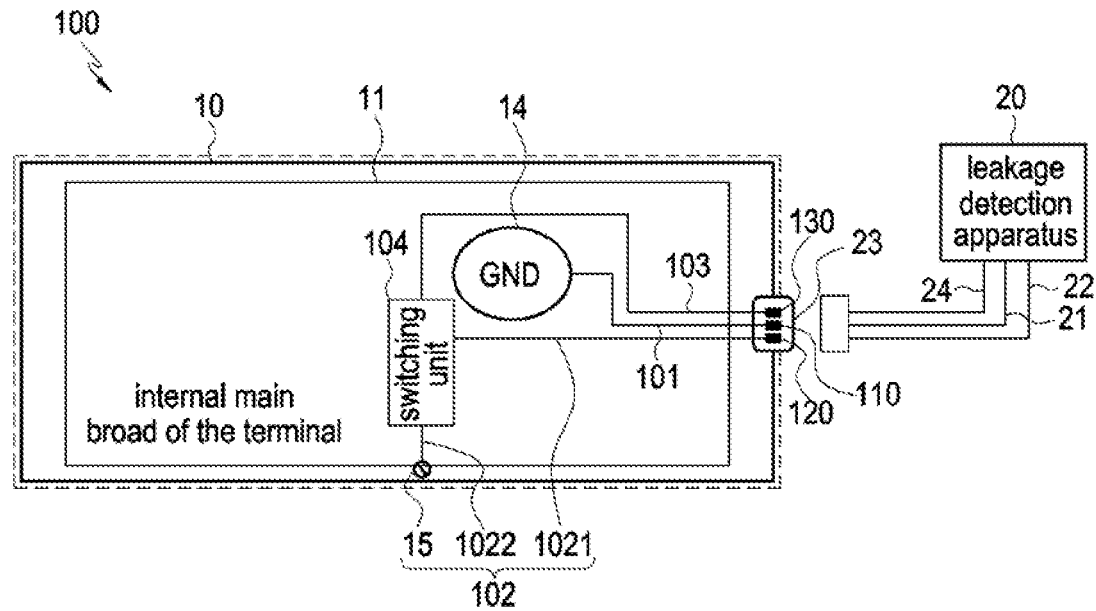
FIGS. 5 to 8 are schematic diagrams illustrating a configuration of a terminal supporting leakage detection according to different exemplary embodiments of the present invention, respectively.

In addition, as shown in FIG. 5, the terminal 100 may further include a switching unit 104, which may be configured to be connected to the second access end 120 and the metal portion 10, and to connect the second access end 120 and the metal portion 10 or disconnect the second access end 120 from the metal portion 10. This will be described in detail below with reference to FIGS. 5 and 6.

FIG. 5 is a schematic diagram illustrating a configuration of a terminal supporting leakage detection according to an exemplary embodiment of the present invention.

As shown in FIG. 5, a terminal 100 may include a first conductive unit 101, a second conductive unit 102, a third conductive unit 103, a first access end 110, a second access end 120, a third access end 130, and a switching unit 104.

In particular, the first access end 110 may be configured to be connected inside the terminal 100 to a ground line GND 14 of a main board 11 of the terminal 100 through the first conductive unit 101, and used to access a ground line GND 21 of a external leakage detection apparatus 20.

The second conductive unit 102 may be composed of a plurality of components, for example, may include a wire 1021, a wire 1022, and a metal dome/conductive foam 15.

The switching unit 104 may be configured to be connected to the second access end 120 and a metal portion 10. In particular, the switching unit 104 may be connected to the second access end 120 through the wire 1021 of the second conductive unit 102, and connected to the metal portion 10 of the terminal 100 through the wire 1022 and the metal shrapnel/conductive foam 15 of the second conductive unit 102.

Further, the switching unit 104 may be configured to connect the second access end 120 and the metal portion 10 or disconnect the second access end 120 from the metal portion 10. In particular, the switching unit 104 may connect the wire 1021 and the wire 1022 so that the second access end 120 may be connected to the metal portion 10 of the terminal 100 through the metal dome/conductive foam 15, that is, the second access end 120 may be configured to be connected inside the terminal 100 to the metal portion 10 of a outer casing of the terminal 100 through the second conductive unit 102. Further, the switching unit 104 may disconnect the wire 1021 from the wire 1022, thereby disconnecting the second access end 120 from the metal portion 10. Additionally, the second access end 120 may be used to access a leakage test line 22 of the leakage detection apparatus 20.

The third access end 130 may be configured to be connected to the switching unit 104 through the third conductive unit 103 inside the terminal 100 and used to access a control signal line 24 of the leakage detection apparatus 20, wherein the third conductive unit 103 may be a wire, and the third access end 130 may be a pin of a external interface 23 of the terminal 100. For example, the third access end 130 may be implemented via an unused reserved pin of the external interface 23.

Further, the switching unit 104 may connect the second access end 120 and the metal portion 10 or disconnect the second access end 120 from the metal portion 10 according to a control signal received from the third access end 130.

In particular, the switching unit 104 may directly receive the control signal from the external leakage detection apparatus 20 through the third access end 130, and connect the wire 1021 and the wire 1022 of the second access end 120 according to the received control signal, thereby connecting the second access end 120 and the metal portion 10. On this basis, the leakage detection apparatus 20 may input a test current to the first access end 110 of the terminal 100 through the ground line GND 21, and then the leakage detection apparatus 20 may determine, through the leakage test line 22, whether a leakage current is detected from the second access end 120 of the terminal 100.

If the leakage detection apparatus 20 has determined that a leakage current is detected from the second access end 120 of the terminal 100, it may be determined that there is leakage between the ground line GND 14 and the metal portion 10 of the terminal 100. If the leakage detection apparatus 20 has determined that a leakage current is not detected from the second access end 120 of the terminal 100, it may be determined that there is no leakage between the ground line GND 14 and the metal portion 10 of the terminal 100.

In addition, after the leakage test of the terminal 100 is completed, the switching unit 104 may disconnect the wire 1021 from the wire 1022 included in the second conductive unit 102 according to a control signal from the leakage detection apparatus 20, thereby disconnecting the second access end 120 from the metal portion 10, and the second access end 120 is suspended, thereby preventing the terminal 100 from being mishandled by using the second access end 120, or the switching unit 104 may not suspend the second access end 120, and the second access end 120 and the second conductive unit 102 are used as a necessary trace of the terminal 100, thereby all the pins on the external interface 23 may be effectively utilized, and then the use efficiency of the external interface 23 is improved.

Figure 6:
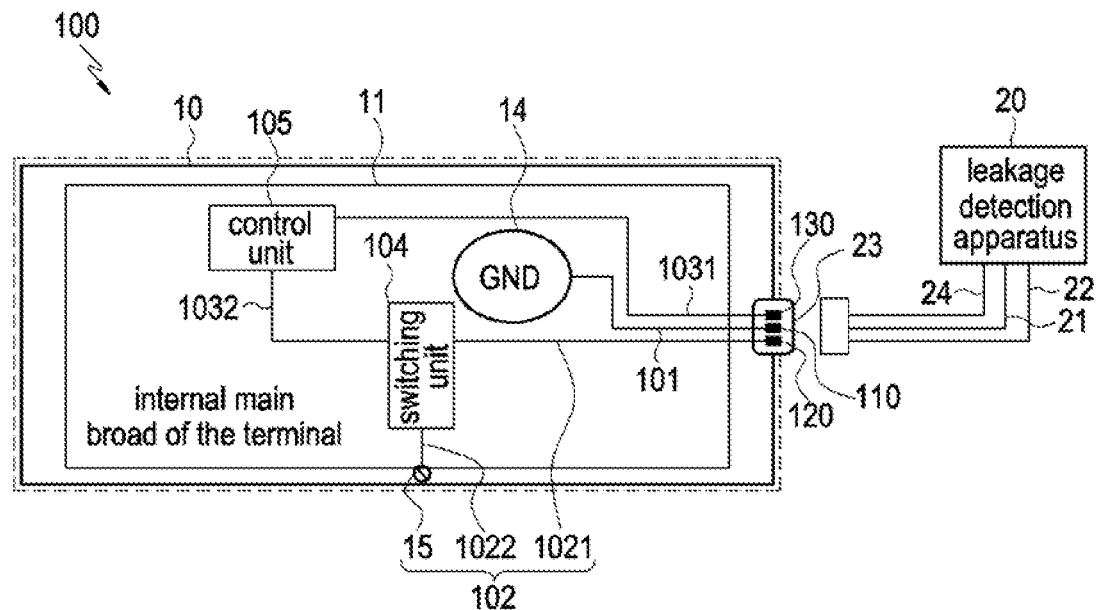

In addition, as shown in FIG. 6, the terminal 100 may further include a control unit 105, wherein the control unit 105 may be connected to the switching unit 104 and the third access end 130 through the third conductive unit 103, and used to control the switching unit 104 to connect the second access end 120 and the metal portion 10 or disconnect the second access end 120 from the metal portion 10 according to a control signal received from the leakage detection apparatus 20 via the three access end 130. This will be described in detail below with reference to FIG. 6.

FIG. 6 is a schematic diagram illustrating a configuration of a terminal supporting leakage detection according to another exemplary embodiment of the present invention.

As shown in FIG. 6, a terminal 100 may include a first conductive unit 101, a second conductive unit 102, a third conductive unit 103, a first access end 110, a second access end 120, and a third access end 130, a switching unit 104 and a control unit 105.

In particular, the first access end 110 may be configured to be connected inside the terminal 100 to a ground line GND 14 of a main board 11 of the terminal 100 through the first conductive unit 101, and used to access a ground line GND 21 of an external leakage detection apparatus 20.

The second conductive unit 102 may be composed of a plurality of components, for example, may include a wire 1021, a wire 1022, and a metal dome/conductive foam 15.

The switching unit 104 may be configured to be connected to the second access end 120 and a metal portion 10, in particular, the switching unit 104 is connected to the second access end 120 through the wire 1021 of the second conductive unit 102, and connected to the metal portion 10 of the terminal 100 through the wire 1022 and the metal dome/conductive foam 15 of the second conductive unit 102.

Further, the switching unit 104 may be configured to connect the second access end 120 and the metal portion 10 or disconnect the second access end 120 from the metal portion 10. In particular, the switching unit 104 may connect the wire 1021 and the wire 1022 so that the second access end 120 may be connected to the metal portion 10 of the terminal 100 through the metal dome/conductive foam 15, and in this case, the second access end 120 may be connected inside the terminal 100 to the metal portion 10 of a outer casing of the terminal 100 through the second conductive unit 102. Further, the switching unit 104 may disconnect the wire 1021 from the wire 1022, thereby disconnecting the second access end 120 from the metal portion 10. Additionally, the second access end 120 may be used to access a leakage test line 22 of the leakage detection apparatus 20.

The third conductive unit 103 may include a wire 1031 and a wire 1032. The control unit 105 may be connected to the third access end 130 through the wire 1031 of the third conductive unit 103, and connected to the switching unit 104 through the wire 1032 in the third conductive unit 103. The third access end 130 may be used to access a control signal line 24 of the leakage detection apparatus 20, wherein the third conductive unit 103 may be a wire, and the third access end 130 is a pin of an external interface 23 of the terminal 100.

The control unit 105 may be used to control the switching unit 104 to connect the second access end 120 and the metal portion 10 or disconnect the second access end 120 from the metal portion 10 according to the control signal received from the leakage detection apparatus 20 through the third access end 130. The control unit 105 may be a central processing unit of the terminal 100 or a processing unit independent of the central processing unit.

In specifically, the control unit 105 may receive the control signal input by the leakage detection apparatus 20 through the third access end 130, and control the switching unit 104 to connect the wire 1021 and the wire 1022 included in the second conductive unit 102, thereby connecting the second access end 120 and the metal portion 10. On this basis, the leakage detection apparatus 20 may input a test current to the first access end 110 of the terminal 100 through the ground line GND 21, and then the leakage detection apparatus 20 may determine through the leakage test line 22 whether a leakage current is detected from the second access end 120 of the terminal 100.

If the leakage detection apparatus 20 has determined that a leakage current is detected from the second access end 120 of the terminal 100, it may be determined that there is leakage between the ground line GND 14 and the metal portion 10 of the terminal 100. If the leakage detection apparatus 20 has determined that a leakage current is not detected from the second access end 120 of the terminal 100, it may be determined that there is no leakage between the ground line GND 14 and the metal portion 10 of the terminal 100.

In addition, after the leakage test of the terminal 100 is completed, the control unit 105 may control the switching unit 104 to disconnect the wire 1021 from the wire 1022 included in the second conductive unit 102 according to the control signal from the leakage detection apparatus 20, thereby disconnecting the second access end 120 from the metal portion 10, and the second access end 120 be suspended, and then preventing the terminal 100 from being mishandled by using the second access end 120, or the control unit 105 may not suspend the second access end 120, and the second access end 120 and the second conductive unit 102 may be used as a necessary trace of the terminal, thereby all the pins on the external interface 23 may be effectively utilized, and then the use efficiency of interface 23 is improved.

In the examples shown in FIGS. 5 and 6, the first access end 110, the second access end 120, and the third access end 103 all are pins of the same external interface 23 (i.e., a USB interface) of the terminal. The first access end 110 is a pin that is inherent in the external interface 23 and is connected to the ground line GND 14 inside the terminal 100 through the first conductive unit 101. When the control unit 105 is a central processing unit of the terminal 100, the third access end 130 may be a pin that is inherent in the external interface 23 and is connected to a control line of the central processing unit inside the terminal 100 through the third conductive unit 103; when the control unit 105 is a processing unit independent of the central processing unit of the terminal 100, the third access end 130 may be implemented by utilizing a reserved pin that is not used in the external interface 23, and the reserved pin may be connected to the control unit 105 through the third conductive unit 103 (i.e., a separate trace) inside the terminal 100. The second access end 120 may be implemented by utilizing a reserved pin that is not used in the external interface 23, and the reserved pin may be finally connected to the metal portion 10 through the second conductive unit 102 inside the terminal 100, that is, finally connected to the metal portion 10 through the metal dome or the conductive foam 15 included in the second conductive unit 102.

In the example described above, the switching unit 104 and the control unit 105 are two independent components, however, the present invention is not limited thereto, i.e., the switching unit 104 may be built in the control unit 105.

In examples described above with reference to FIGS. 3, 5, and 6, the terminal 100 may be used by the leakage detection apparatus 20 to detect whether there is leakage in one continuous metal portion 10 existing in the outer casing of the terminal 100, however, this is merely an exemplary embodiment. The present invention is not limited thereto, that is, the terminal 100 may be used by the leakage detection apparatus 20 to detect whether there is leakage in each of a plurality of metal portions that are insulated and separated from each other on the outer casing. This will be described in detail below with reference to FIGS. 7 and 8.

Figure 7:
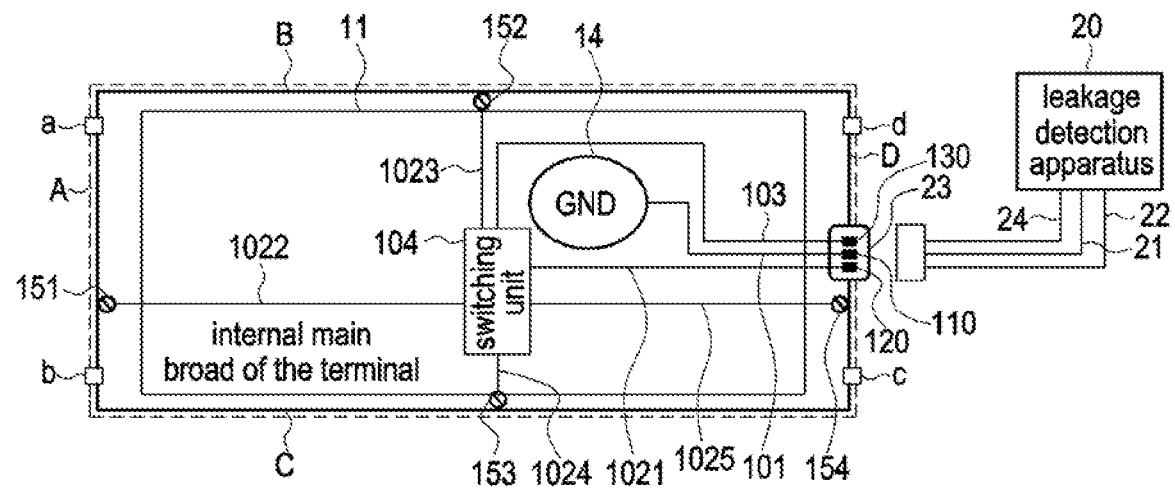

FIG. 7 is a schematic diagram illustrating a configuration of a terminal supporting leakage detection according to another exemplary embodiment of the present invention.

As shown in FIG. 7, when the metal portion includes a plurality of metal portions that are insulated and separated from each other, a switching unit 104 connects at least one of the plurality of metal portions to a second access end 120 according to a control signal received from a third access end, so that a leakage detection apparatus 20 may determine whether a leakage current is detected from a second access end 120 of a terminal 100 with respect to a specified metal portion of the plurality of metal portions.

In specifically, as shown in FIG. 7, it is assumed that there are four metal portions separated from each other by insulating members a, b, c, and d on a outer casing of the terminal 100, i.e., a first metal portion A, a second metal portion B, a third metal portion C and a fourth metal portion D. In this case, the terminal 100 may include a first conductive unit 101, a third conductive unit 103, a first access end 110, a second access end 120, a third access end 130, and a switching unit 104. In addition, the terminal 100 may further include a second conductive unit, wherein the second conductive unit may include wires 1021, 1022, 1023, 1024, and 1025 and metal domes/conductive foams 151, 152, 153, and 154.

The first access end 110 may be configured to be connected to a ground line of a main board 11 of the terminal 100 through the first conductive unit 101 and to access a ground line 21 of the external leakage detection apparatus 20. The switching unit 104 may be connected to the second access end 120 through the wire 1021, and respectively connected to the first metal portion A, the second metal portion B, the third metal portion C, and the fourth metal portion D through the wire 1022 and the metal dome/conductive foam 151, the wire 1023 and the metal dome/conductive foam 152, the wire 1024 and the metal dome/conductive foam 153, the wire 1025 and the metal dome/conductive foam 154. Additionally, the second access end 120 may be used to access a leakage test line 22 of the leakage detection apparatus 20. The third access end 130 may be connected to the switching unit 104 of the terminal 100 through the third conductive unit 103 and used to access a control signal line 24 of the leakage detection apparatus 20.

The switching unit 104 may only connect the wire 1021 and the wire 1022 according to a control signal received from the leakage detection apparatus 20 through the third access end 130, so that the second access end 120 is connected to the first metal portion A through the metal dome/conductive foam 151 connected to the wire 1022, and the second access end 120 is disconnected from the other metal portions (i.e., the metal portions B, C, and D), thereby the leakage detection apparatus 20 may determine whether a leakage current is detected from the second access end 120 only with respect to the currently connected first metal portion A.

In specifically, in the case that the switching unit 104 only connect the second access end 120 and the first metal portion A, the leakage detection apparatus 20 may input a test current to the first access end 110 of the terminal 100 through the ground line GND 21, and then determines through the leakage test line 22 whether a leakage current is detected from the second access end 120 of the terminal 100. If the leakage detection apparatus 20 has determined that a leakage current is detected from the second access end 120 of the terminal 100, it may be determined that there is leakage between the ground line GND 14 of the terminal 100 and the first metal portion A. If the leakage detection apparatus 20 has determined that a leakage current is not detected from the second access end 120 of the terminal 100, it may be determined that there is no leakage between the ground line GND 14 of the terminal 100 and the first metal portion A.

After detecting whether there is leakage in the first metal portion A, the switching unit 104 may only connect the wire 1021 and the wire 1023 according to a control signal received from the leakage detection apparatus 20 through the third access end 130, so that the second access end 120 is connected to the second metal portion B via the metal dome/conductive foam 152 connected to the wire 1023 and the second access end 120 is disconnected from the other metal portions (i.e., the metal portions A, C, and D).

Thereafter, the leakage detection apparatus 20 may sequentially detect whether there is leakage between the ground line GND 14 and the second metal portion B, between the ground line GND 14 and the third metal portion C, and between the ground line GND 14 and the fourth metal portion D in a manner similar to that of detecting the first metal portion A. In addition, after detecting whether there is leakage between the ground line GND 14 and the fourth metal portion D, the switching unit 104 may disconnect the wire 1021 from the wire 1025 included in the second conductive unit according to a control signal from the leakage detection apparatus 20, thereby the second access end 120 is disconnected from the fourth metal portion D, and the second access end 120 is suspended, and then preventing the terminal from being mishandled by using the second access end 120, or the switching unit 104 may not suspend the second access end 120, but the second access end 120 and the second conductive unit are used as a necessary trace of the terminal 100, thereby effectively utilizing all the pins on the external interface 23, and then the use efficiency of the external interface 23 is improved.

In the example shown in FIG. 7, the outer casing of the terminal 100 has four metal portions, however this is merely an example, and the present invention is not limited thereto, and the outer casing of the terminal 100 may have two, three, five or more metal portions.

Further, in the above description, the switching unit 104 connects the second access end 120 to only one metal portion at a time according to a control signal received through the third access end 130 from the leakage detection apparatus 20, but this is merely an example, the present invention is not limited thereto, and the switching unit 104 may connect at least one of the plurality of metal portions to the second access end 120 at a time according to a control signal received through the third access end 130 from the leakage detection apparatus 20, so that the leakage detection apparatus 20 may simultaneously detect, with respect to the at least one metal portion connected to the second access end 120 at a time, whether a leakage current is detected from the second access end 120 of the terminal 100.

In the example described above with reference to FIG. 7, the terminal 100 controls to connect the second access end 120 to metal portions on the outer casing of the terminal 100 through one switching unit 104, however, the present invention is not limited thereto, that is, the switching unit 104 may be a plurality of switching units that may achieve the same function as that of the switching unit 104 in the example described above with reference to FIG. 7.

Further, in the embodiment described above with reference to FIG. 7, the switching unit 104 directly receives a control signal from the external leakage detection apparatus 20, and then connects at least one of the plurality of metal portions and the second access end 120 according to the received control signal, and then performs the leakage detection, but the present invention may set a control unit 105 in the terminal 100, and the control unit 105 receives a control signal from the external leakage detection apparatus 20 through the third access end 130, and then controls the switching unit 104 to connect the second access end 120 and the at least one of the plurality of metal portions or disconnect the second access end 120 and the at least one metal portions according to the received control signal. This will be described in detail below with reference to FIG. 8.

Figure 8:
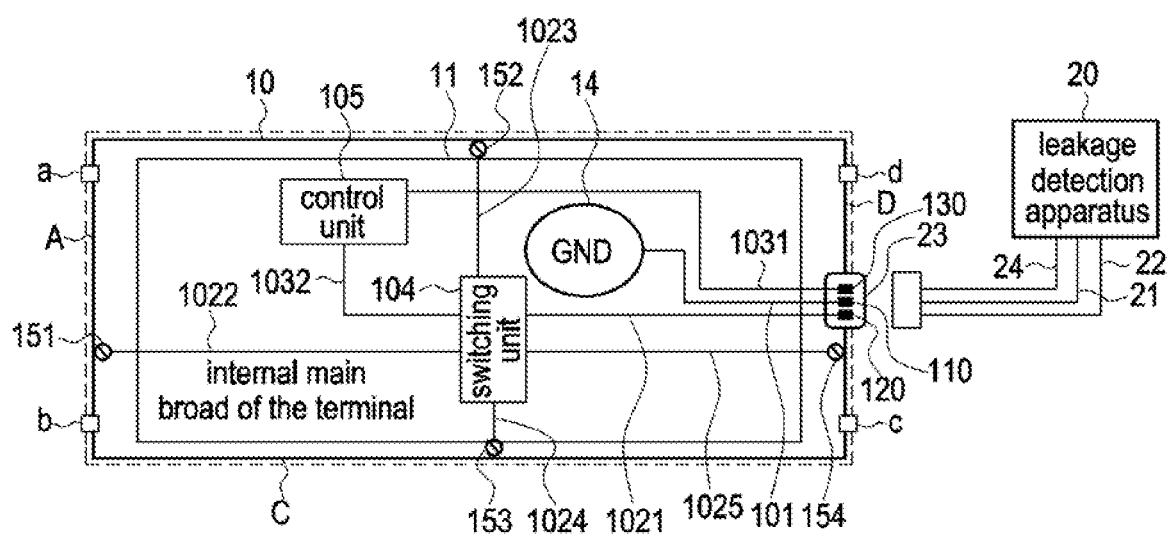

FIG. 8 is a schematic diagram illustrating a configuration of a terminal supporting leakage detection according to another exemplary embodiment of the present invention. As shown in FIG. 8, the terminal 100 may include a first conductive unit 101, a second conductive unit, a third conductive unit, a first access end 110, a second access end 120, a third access end 130, a switching unit. 104 and a control unit 105, wherein the second conductive unit includes wires 1021, 1022, 1023, 1024, and 1025 and metal dome/conductive foams 151, 152, 153, and 154, and the third conductive unit includes wires 1031 and 1032. Since the connection relationship among the first access end 110, the second access end 120, the first conductive unit 101, the second conductive unit, the metal portions (i.e., A, B, C, and D) and the switching unit 104 is the same as the connection relationship among the above components in FIG. 7, the repeated description will not be repeated here. Only the differences between FIG. 8 and FIG. 7 will be described below.

In specifically, a control unit 105 may be connected to the third access end 130 through the wire 1031 included in the third conductive unit, and connected to a switching unit 104 through the wire 1032 included in the third conductive unit. That is say, unlike the embodiment shown in FIG. 7, the switching unit 104 is not directly connected to the third access end 130. The third access end 130 may be used to access a control signal line 24 of a leakage detection apparatus 20, wherein the third access end 130 may be a pin of the external interface 23 of the terminal 100.

The control unit 105 may be used to control the switching unit 104 to connect at least one of the plurality of metal portions to the second access end 120 according to a control signal received from the leakage detection apparatus 20 through the third access end 130, so that the leakage detection apparatus 20 may determine whether a leakage current is detected from the second access end 120 of the terminal 100 with respect to a specified one of the plurality of metal portions. The control unit 105 may be a central processing unit of the terminal 100 and also may be a processing unit independent of the central processing unit.

In specifically, as shown in FIG. 8, the control unit 105 may control the switching unit 104 to only connect the wire 1021 to the wire 1022 according to a control signal received from the leakage detection apparatus 20 through the third access end 130, so that the second access end 120 is connected to the first metal portion A through the metal dome/conductive foam 151 connected to the wire 1022, and disconnect the second access end 120 from the other metal portions (i.e., the metal portions B, C, and D), so that the leakage detection apparatus 20 may determine whether a leakage current is detected from the second access end 120 only with respect to the currently connected first metal portion A.

In specifically, in the case where the control unit 105 controls the switching unit 104 to only connect the second access end 120 to the first metal portion A according to the received control signal, the leakage detection apparatus 20 may input a test current to the first access end 110 of the terminal 100 through a ground line GND 21, and then determines through a leakage test line 22 whether a leakage current is detected from the second access end 120 of the terminal 100. If the leakage detection apparatus 20 has determined that a leakage current is detected from the second access end 120 of the terminal 100, it may be determined that there is leakage between a ground line GND 14 and the first metal portion A of the terminal 100. If the leakage detection apparatus 20 has determined that a leakage current is not detected from the second access end 120 of the terminal 100, it may be determined that there is no leakage between the ground line GND 14 and the first metal portion A of the terminal 100.

After detecting whether there is leakage in the first metal portion A, thereafter, the leakage detection apparatus 20 may sequentially detect whether there is leakage between the ground line GND 14 and the second metal portion B, between the ground line GND 14 and the third metal portion C, and between the ground line GND 14 and the fourth metal portion D in a manner similar to that of detecting the first metal portion A. In addition, after detecting whether there is leakage between the ground line GND 14 and the fourth metal portion D, the control unit 105 may control the switching unit 104 to disconnect the wire 1021 from the wire 1025 included in the second conductive unit according to a control signal from the leakage detection apparatus 20, so that the second access end 120 is disconnected from the fourth metal portion D, and the second access end 120 is suspended, thereby preventing the terminal from being mishandled by using the second access end 120, or the control unit 105 may not suspend the second access end 120, and the second access end 120 and the second conductive unit are used as a necessary trace of the terminal 100, so that all the pins on the external interfaces 23 may be effectively utilized, and then the use efficiency of the external interface 23 is improved. In the example shown in FIG. 8, the outer casing of the terminal 100 has four metal portions, however this is merely an example, and the present invention is not limited thereto, and the outer casing of the terminal 100 may have two, three, five or more metal portions.

In the examples shown in FIG. 3 and FIG. 5 to FIG. 8, the first access end 110, the second access end 120 and the third end 103 all are pins of the same external interface 23 (for example, a USB interface) of the terminal 100, however this is merely an exemplary embodiment, and the invention is not limited thereto. For example, when there is no reserved pin that may be used as the second access end 120 in the external interface 23, and there are a GND pin and a control signal line pin that have been used as the first access end 110 and the third access end 130, respectively, the second access end 120 and the second conductive unit 102 of configurations as shown in FIG. 9, FIG. 10 and FIG. 11 may be utilized, wherein the leakage detection apparatus 20 may be connected to the second access end 120 through contact with each other by inserting the probe 81 connected to leakage detection apparatus 20's own leakage test line 22 into a insertion hole of the terminal 100, i.e., the second access end 120 is an access end that may be connected through the insertion hole of the terminal 100, in other words, the second access end 120 is exposed in the insertion hole of the terminal 100 so that the probe 81 of the leakage detection apparatus 20 may be connected to the second access end 120 through contact with each other in the insertion hole.

Figure 9:
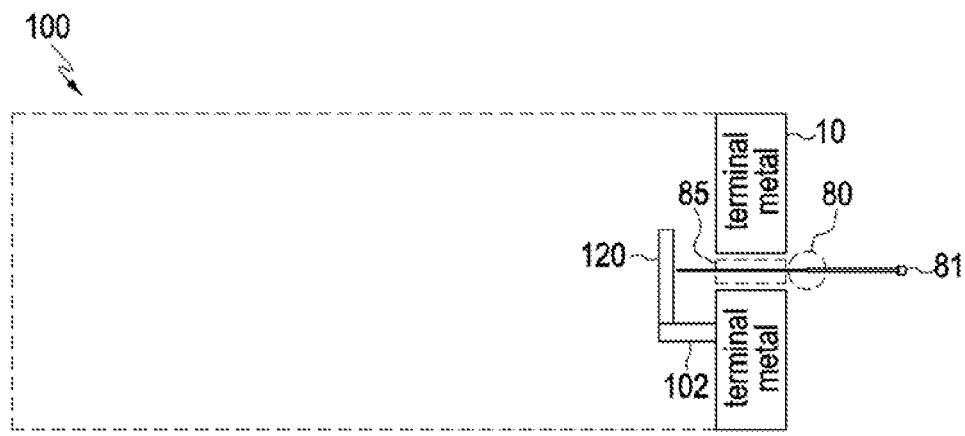
FIG. 9 illustrates a diagram a configuration of a second access end in a terminal according to an exemplary embodiment of the present invention.
Figure 12:
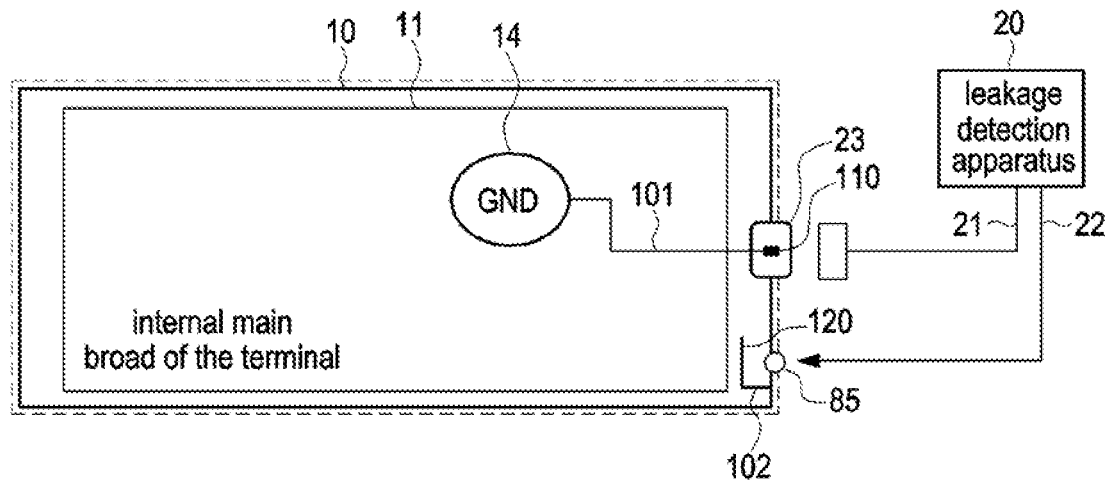
FIG. 12 is a schematic diagram illustrating a configuration of a terminal supporting leakage detection including the second access end of the configuration as shown FIG. 9 according to an exemplary embodiment of the present invention.

In specifically, for example, when the metal portion 10 of the terminal is one continuous metal portion, the second access end 120 may be implemented by utilizing a metal baffle 120 as shown in FIG. 9, wherein the second access end 120 is directly connected inside the terminal 100 to the metal portion 10 of the terminal 100 through the second conductive unit 102 to achieve connection with the metal portion 10. In this case, the terminal 100 shown in FIG. 12 may be realized, since components indicated by respective numerals and the operation methods of the terminal 100 shown in FIG. 12 are the same as or similar to components indicated by the respective numerals and the operation methods of the terminal 100 shown by referring to FIG. 3, the repeated description is not repeated here. Further, in order to protect the baffle 120 for realizing the second access end 120, the probe 81 of the leakage detection apparatus 20 inserted into the insertion hole 85 on the terminal 100 has a certain contraction rate at its front end, wherein the probe 81 may be contracted (as shown in 80 of FIG. 9) when it is in contact with the metal baffle 120 through the insertion hole 85, thereby a hard contact which may cause damage to the probe 81 or the metal baffle 120 may be avoided.

Figure 10:
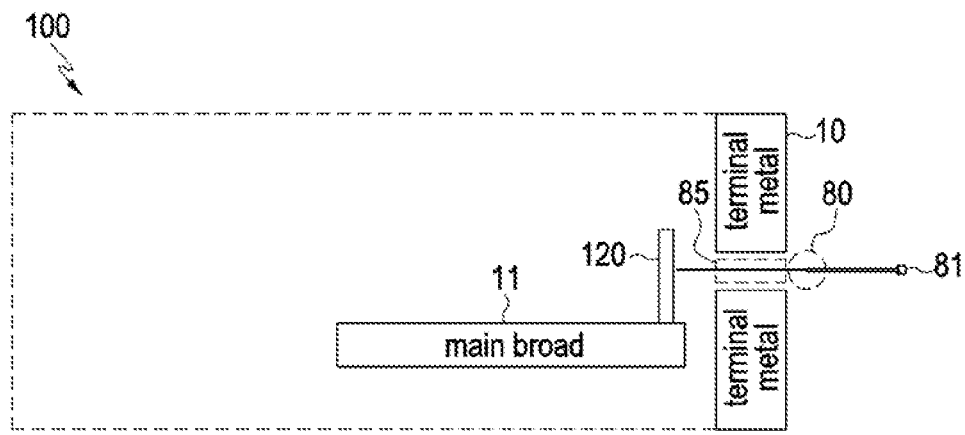
FIG. 10 illustrates a diagram a configuration of a second access end in a terminal according to another exemplary embodiment of the present invention.
Figure 13:
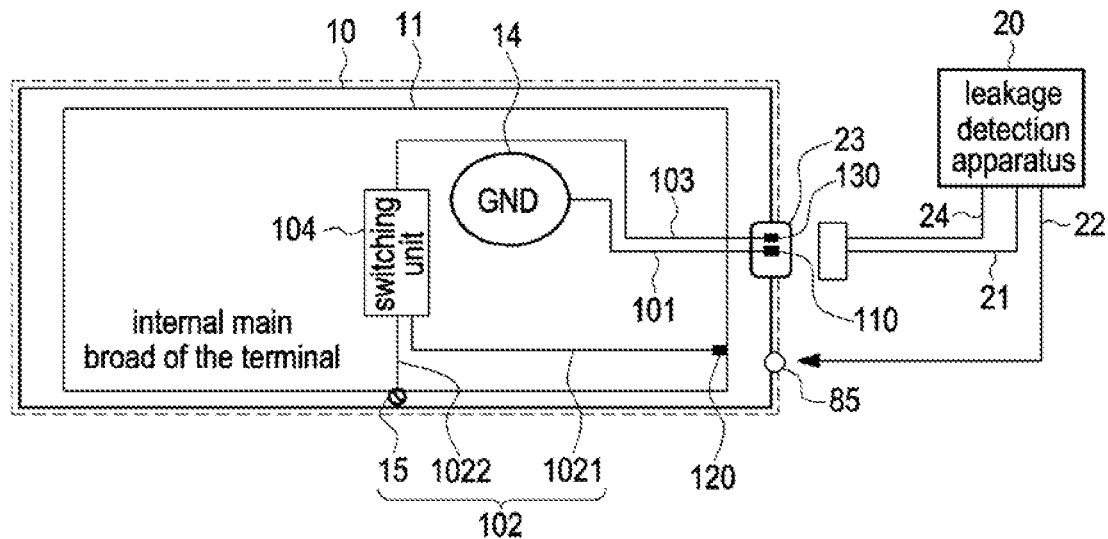
FIGS. 13 to 16 are schematics diagrams illustrating a configuration of a terminal supporting leakage detection including the second access end of the configuration as shown FIG. 8 or 9 according to different exemplary embodiments of the present invention, respectively.
Figure 14:
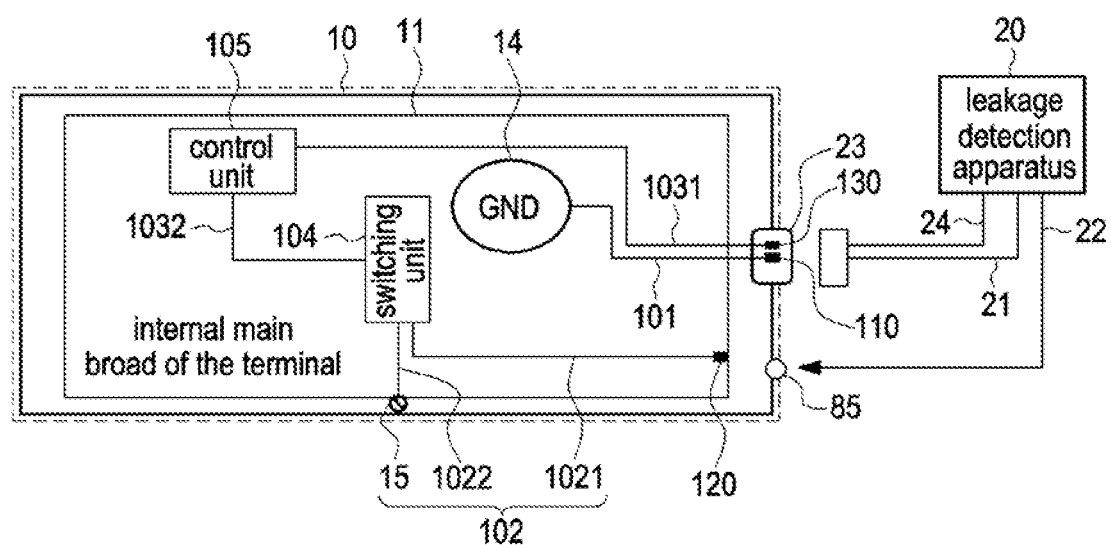
Figure 15:
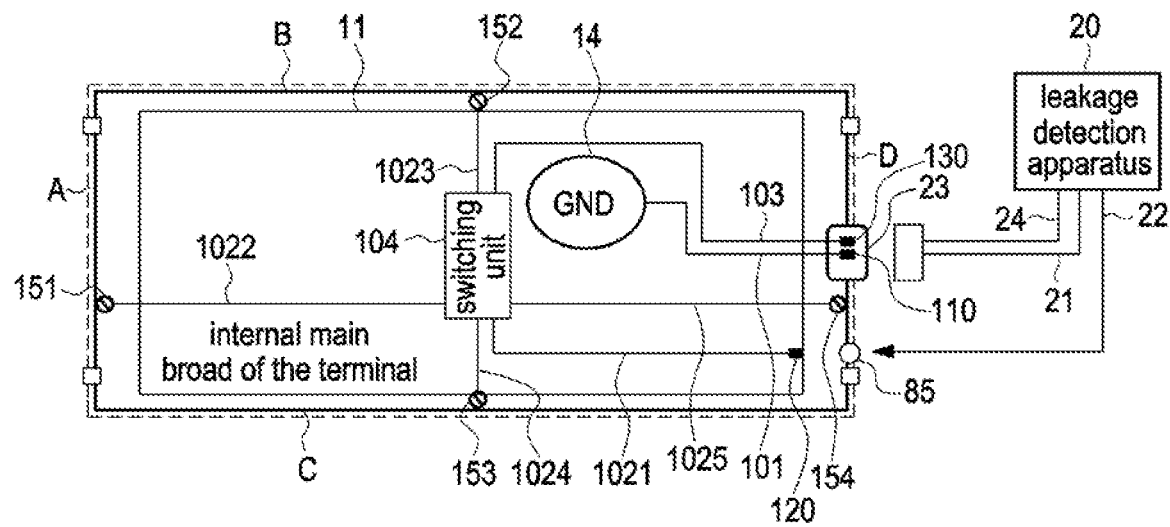
Figure 16:
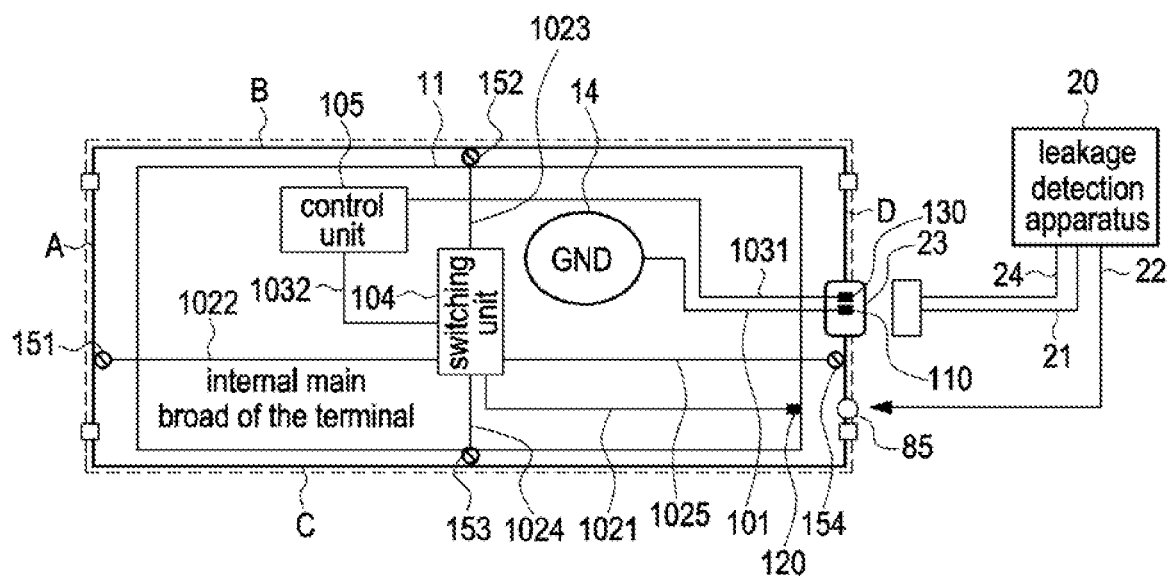

Alternatively, when the metal portion 10 of the terminal is one continuous metal portion or includes a plurality of metal portions that are insulated and separated from each other, the second access end 120 may be connected to a switching unit (for example, the switching unit 104 in FIGS. 13 to 16) on a main board 11 in a manner as shown in FIG. 10, i.e., the second access end 120 may be implemented as a metal baffle 120 disposed on the main board 11 of the terminal 100, wherein the metal baffle 120 is connected to the switching unit located on the main board 11 by a second conductive unit (for example, the second conductive unit 102 in FIGS. 13 and 14) such as a separate trace inside the main board 11, and in this case, the switching unit is connected to the metal portion 10 of the terminal 100 through other conductors and/or metal domes/conductive foams included in the second conductive unit (for example, the wire 1022 and the metal domes/conductive foam 15 in FIGS. 13 and 14, or the wires 1022-1025 and the metal domes/conductive foams 151-154 in FIGS. 15 and 16). That is say, the manner shown in FIG. 10 for connecting the second access end to the switching unit and further connecting the switching unit to the metal portion 10 is applied to the situation in which the metal baffle 120 may be disposed on the main board 11.

Figure 11:
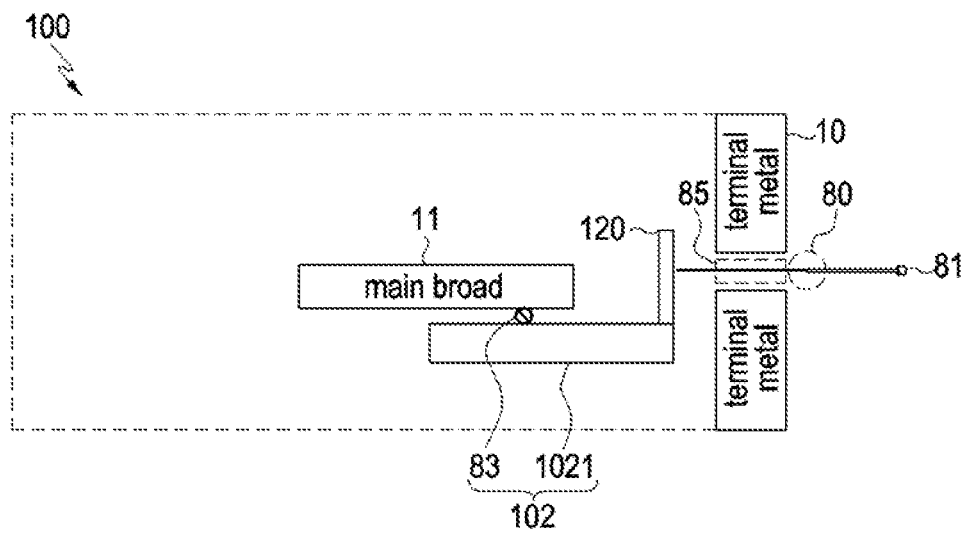
FIG. 11 illustrates a diagram a configuration of a second access end in a terminal according to another exemplary embodiment of the present invention.

Alternatively, when the metal portion 10 of the terminal 100 is one continuous metal portion or includes a plurality of metal portions that are insulated and separated from each other, and the metal baffle 120 can not be disposed on the main board 11 of the terminal 100, the second access end 120 may be connected to a switching unit (for example, the switching unit 104 in FIGS. 13 to 16) on the main board 11 in a manner as shown in FIG. 11, that is say, the second access end 120 may be implemented as a separately existing metal baffle 120 by an independent design method, and then the metal baffle 120 is connected to the switching unit on the main board 11 through the conductor 1021 and the metal dome/conductive foam 83 included in the second conductive unit 102, and the switching unit is connected to the metal portion 10 of the terminal 100 through other conductors and metal domes/conductive foams included in the second conductive unit 102 (for example, the wire 1022 and the metal dome/conductive foam 15 in FIGS. 13 and 14 or the wires 1022-1025 and the metal domes/conductive foams 151-154 in FIGS. 15 and 16). For example, the terminal 100 as shown in FIGS. 13 to 16 may be implemented by using a manner shown in FIG. 11 or 12, since components indicated by the respective numerals and the operation methods of the terminal 100 shown in FIGS. 13 to 16 are the same as or similar to components indicated by the respective numerals and a operation method of the terminal 100 described with reference to FIGS. 5 to 8, the repeated description will not be repeated here.

A detection method of performing leakage detection for the terminal by utilizing the terminal 100 described above will be described in detail below with reference to FIGS. 17 to 21.

Figure 17:
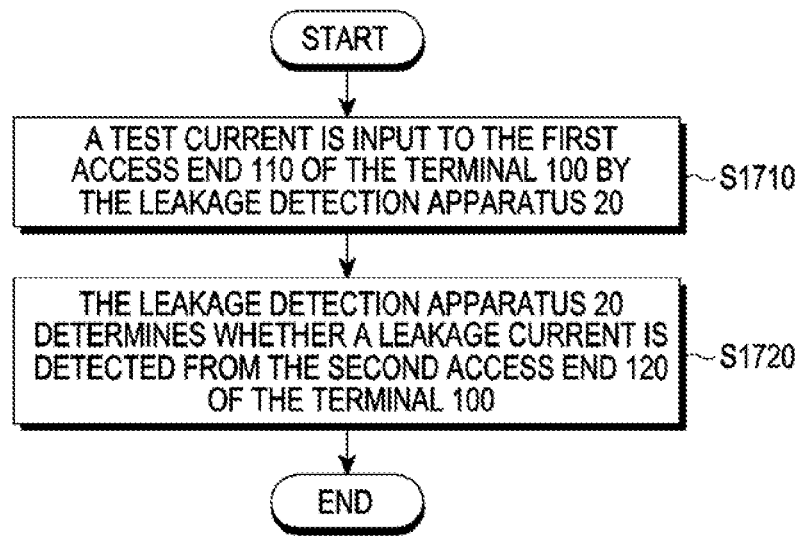
FIGS. 17 to 21 are flowcharts illustrating a detection method for performing leakage detection for a terminal supporting leakage detection according to different exemplary embodiments of the present invention, respectively.

FIG. 17 a flowchart illustrating a detection method for performing leakage detection for the terminal 100 supporting leakage detection according to exemplary embodiment of the present invention, wherein the detection method may be performed by the terminal 100 described with reference to FIGS. 3 and 12.

As shown in FIG. 17, in step S1710, a test current is input to the first access end 110 of the terminal 100 by the leakage detection apparatus 20, wherein the first access end 110 is connected inside the terminal 100 to the ground line GND 14 of the main board 11 of the terminal 100 through the first conductive unit 101 of the terminal 100 and is externally connected to the ground line GND 21 of the leakage detection apparatus 20. Wherein the first conductive unit 101 may be a wire.

In step S1720, the leakage detection apparatus 20 determines whether a leakage current is detected from the second access end 120 of the terminal 100, wherein the second access end 120 is connected inside the terminal 100 to the metal portion 10 of the outer casing of the terminal 100 through the second conductive unit 102 of the terminal 100 and is externally connected to the leakage test line 22 of the leakage detection apparatus 20. In the terminal 100 shown in FIG. 3, the first access end 110 and the second access end 120 are pins of the external interface 23 of the terminal 100. Further, in the terminal 100 shown in FIG. 12, the first access end 110 is a pin of the external interface 23 of the terminal 100, and the second access end 120 is an access end that may be connected through the insertion hole 85 of the terminal 100. The second conductive unit 102 may include a wire (or a metal connector) and a metal dome or a conductive foam.

If the leakage detection apparatus 20 has determined that a leakage current is detected from the second access end 120 of the terminal 100, it is determined that there is leakage between the ground line GND 14 of the terminal 100 and the metal portion 10. If the leakage detection apparatus 20 has determined that a leakage current is not detected from the second access end 120 of the terminal 100, it may be determined that there is no leakage between the ground line GND 14 of the terminal 100 and the metal portion 10.

Since the above process has been described in detail above with reference to FIGS. 3 and 12, the repeated description will not be repeated here.

Figure 18:
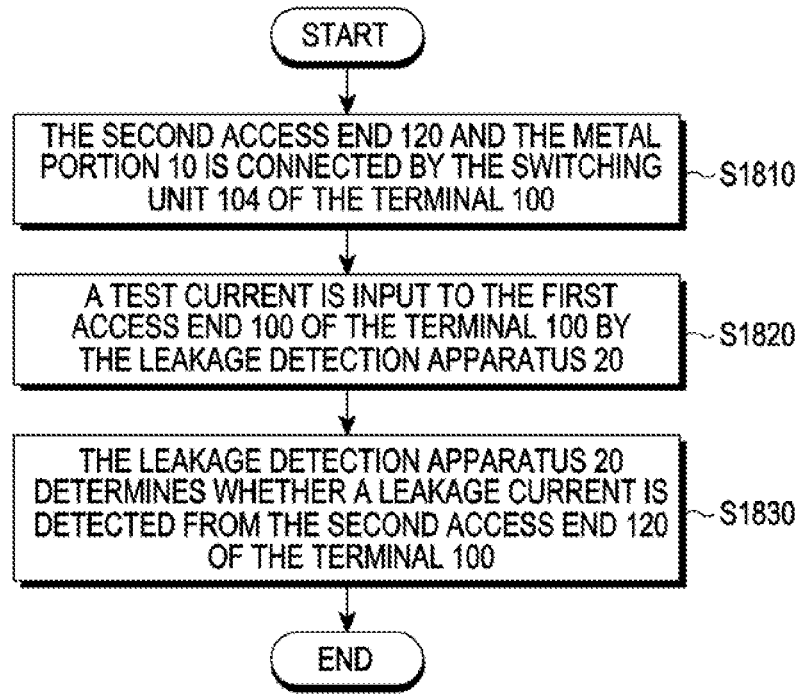

FIG. 18 is a flowchart illustrating a detection method for performing leakage detection for a terminal supporting leakage detection according to another exemplary embodiment of the present invention, wherein the detection method may be performed by the terminal 100 described with reference to FIGS. 5 and 13.

As shown in FIG. 18, in step S1810, the second access end 120 and the metal portion 10 is connected by the switching unit 104 of the terminal 100, wherein the switching unit 104 is connected to the second access end 120 and the metal portion 10. In particular, the switching unit 104 is connected to the second access end 120 through the wire 1021 of the second conductive unit 102, and connected to the metal portion 10 of the outer casing of the terminal 100 through the wire 1022 and the metal dome/conductive foam 15 of the second conductive unit 102, wherein the second access end 120 is externally connected to the leakage test line 22 of the leakage detection apparatus 20.

In particular, the connecting the second access end 120 and the metal portion 10 by the switching unit 104 of the terminal 100 may include receiving a control signal from the leakage detection apparatus 20 through the third access end 130 by the switching unit 104. In this case, the second access end 120 and the metal portion 10 may be connected by the switching unit 104 according to the control signal received from the third access end 130 of the terminal 100, wherein the third access end 130 is connected to the switching unit 104 through the third conductive unit 103 and externally connected to the control signal line 23 of the leakage detection apparatus 20. The third conductive unit 103 is a wire, and the third access end 130 is a pin of the external interface 23 of the terminal 100.

In step S1820, a test current is input to the first access end 110 of the terminal 100 by the leakage detection apparatus 20, wherein the first access end 110 is connected to the ground line GND 14 of the main board 11 of the terminal 100 through the first conductive unit 101 of the terminal 100 and externally connected to the ground line GND 21 of the leakage detection apparatus 20.

In step S1830, the leakage detection apparatus 20 determines whether a leakage current is detected from the second access end 120 of the terminal 100.

If the leakage detection apparatus 20 has determined that a leakage current is detected from the second access end 120 of the terminal 100, it is determined that there is leakage between the ground line GND 14 of the terminal 100 and the metal portion 10. If the leakage detection apparatus 20 has determined that a leakage current is not detected from the second access end 120 of the terminal 100, it may be determined that there is no leakage between the ground line GND 14 of the terminal 100 and the metal portion 10.

In addition, after completing the leakage test of the terminal 100, the control unit 105 may control the switching unit 104 to disconnect the second access end 120 from the metal portion 10 according to a control signal from the leakage detection apparatus 20, thereby the second access end 120 is suspended, and then preventing the terminal from being mishandled by using the second access end 120.

Since the above process has been described in detail above with reference to FIGS. 5 and 13, the repeated description will not be repeated here.

Figure 19:
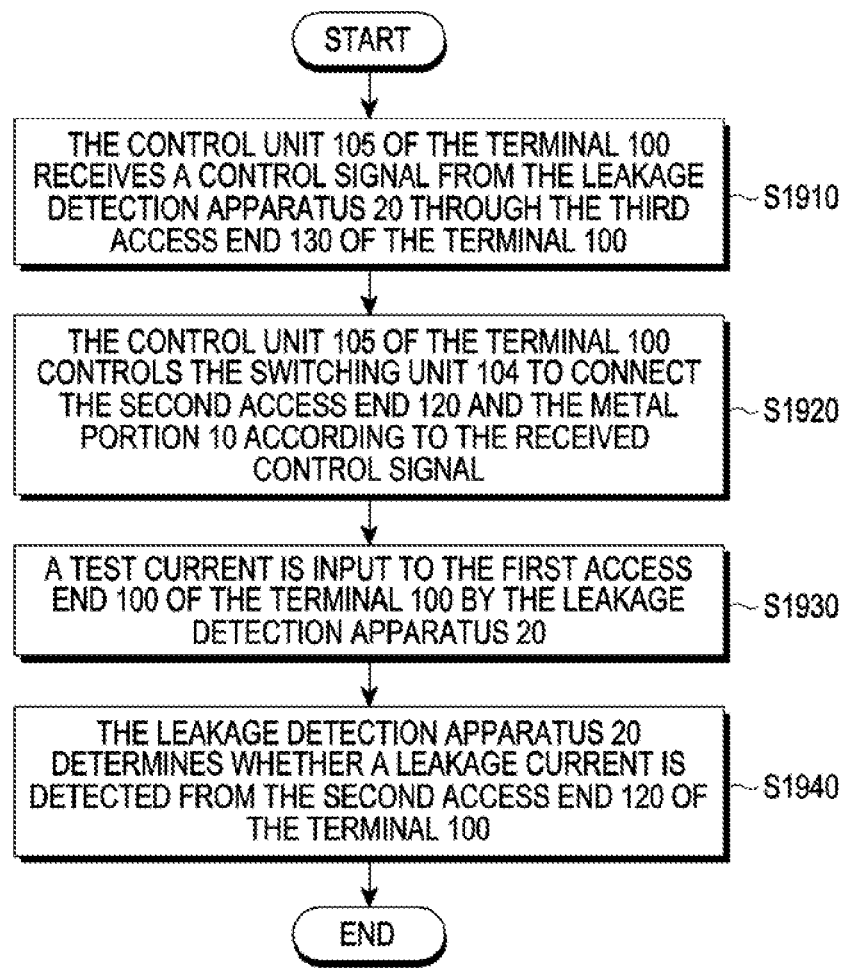

FIG. 19 is a flowchart illustrating a detection method for performing leakage detection for the terminal 100 supporting leakage detection according to another exemplary embodiment of the present invention, wherein the detection method may be performed by the terminal 100 described with reference to FIGS. 6 and 14.

In step S1910, the control unit 105 of the terminal 100 receives a control signal from the leakage detection apparatus 20 through the third access end 130 of the terminal 100, wherein the third access end 130 may be connected to the control unit 105 through the wire 1031 included in the third conductive unit of the terminal 100 and externally connected to the control signal line 23 of the leakage detection apparatus 20. The control unit 105 is connected to the switching unit 104 through the wire 1032 included in the third conductive unit. In other words, the control unit 105 may be connected to the switching unit 104 and the third access end 130 through the third conductive unit.

In step S1920, the control unit 105 of the terminal 100 controls the switching unit 104 to connect the second access end 120 and the metal portion 10 according to the received control signal. The second access end 120 of the terminal 100 is externally connected to the leakage test line 21 of the leakage detection apparatus 20, and the switching unit 104 is connected to the second access end 120 and the metal portion 10. In specifically, the switching unit 104 may be connected to the second access end 120 through the wire 1021 included in the second conductive unit 102, and is connected to the metal portion 10 through the wire 1022 and the metal dome/conductive foam 15 included in the second conductive unit 102.

In step S1930, a test current is input to the first access end 110 of the terminal 100 by the leakage detection apparatus 20, wherein the first access end 110 of the terminal 100 is connected to the ground line GND 14 in the main board 11 of the terminal 100 through the first conductive unit 101 of the terminal 100 and externally connected to the ground line 21 of the leakage detection apparatus 20.

In step S1940, the leakage detection apparatus 20 determines whether a leakage current is detected from the second access end 120 of the terminal 100.

In this case, if the leakage detection apparatus 20 has determined that a leakage current is detected from the second access end 120 of the terminal 100, it is determined that there is a leakage between the ground line GND 14 of the terminal 100 and the metal portion 10. If the leakage detection apparatus 20 has determined that a leakage current is not detected from the second access end 120 of the terminal 100, it may be determined that there is no leakage between the ground line GND 14 of the terminal 100 and the metal portion 10.

In addition, after completing the leakage test of the terminal 100, the control unit 105 may control the switching unit 104 to disconnect the second access end 120 from the metal portion 10 according to a control signal from the leakage detection apparatus 20, thereby the second access end 120 is suspended, and then preventing the terminal 100 from being mishandled by using the second access end 120.

Since the above process has been described in detail above with reference to FIGS. 6 and 14, the repeated description will not be repeated here.

Figure 20:
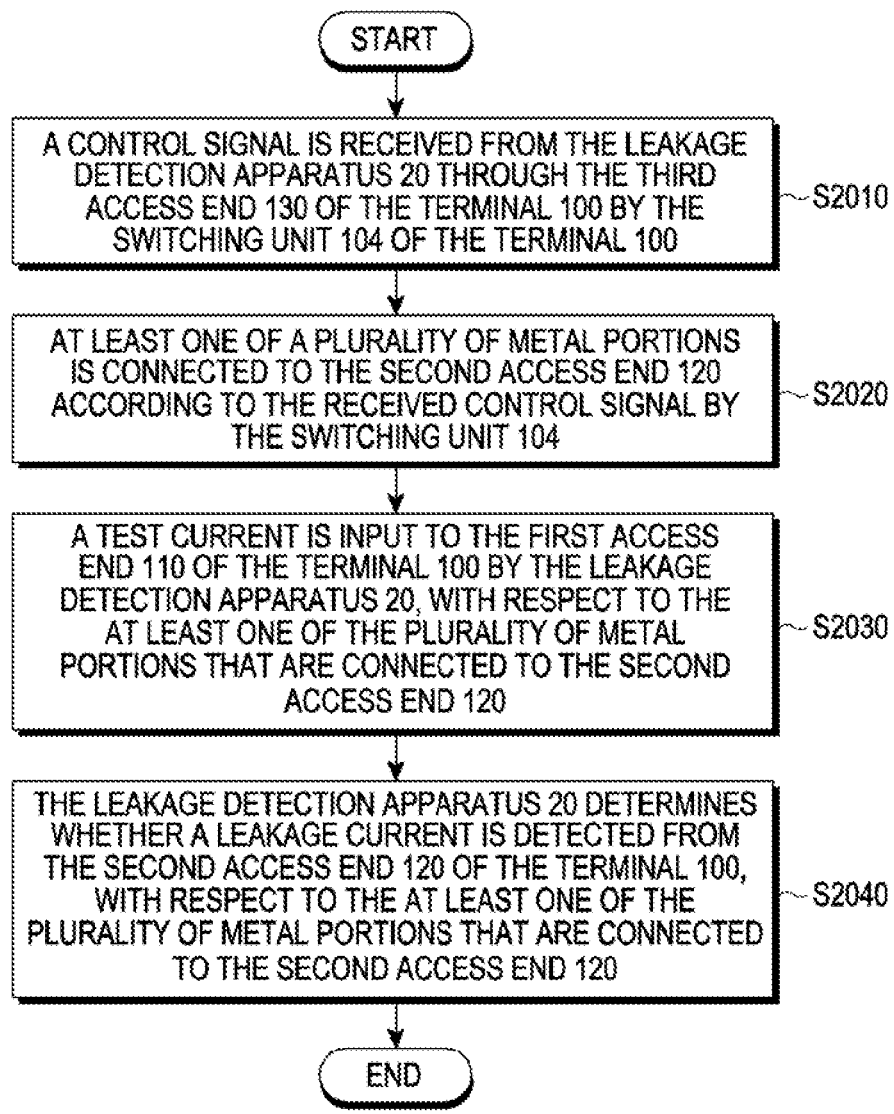

FIG. 20 illustrates a flowchart of a detection method for performing leakage detection for the terminal 100 supporting leakage detection according to another exemplary embodiment of the present invention, wherein the detection method may be performed by the terminal 100 described with reference to FIGS. 7 and 15. Since the connection relationship among the components in the terminal 100 in FIGS. 7 and 15 has been described above, the repeated description will not be repeated below.

As shown in FIG. 20, in step S2010, a control signal is received from the leakage detection apparatus 20 through the third access end 130 of the terminal 100 by the switching unit 104 of the terminal 100.

In step S2020, at least one of a plurality of metal portions is connected to the second access end 120 according to the received control signal by the switching unit 104.

In step S2030, a test current is input to the first access end 110 of the terminal 100 by the leakage detection apparatus 20 with respect to the at least one of the plurality of metal portions that are connected to the second access end 120.

In step S2040, the leakage detection apparatus 20 determine whether a leakage current is detected from the second access end 120 of the terminal 100 with respect to the at least one of the plurality of metal portions that are connected to the second access end 120.

For the at least one of the plurality of metal portions that are connected to the second access end 120, if the leakage detection apparatus 20 has determined that a leakage current is detected from the second access end 120 of the terminal 100, it is determined there is leakage between the ground line GND 14 of the terminal 100 and the at least one metal portion. If the leakage detection apparatus 20 has determined that a leakage current is not detected from the second access end 120 of the terminal 100, it may be determined that there is no leakage between the ground line GND 14 of the terminal 100 and the at least one metal portion.

In addition, after detecting whether there a leakage in all the metal portions, the control unit 105 may control the switching unit 104 to disconnect the second access end 120 from the last detected metal portion according to a control signal from the leakage detection apparatus 20, thereby the second access end 120 may be suspended, and then preventing the terminal 100 from being mishandled by using the second access end 120.

Since the above process has been described in detail above with reference to FIGS. 7 and 15, the repeated description will not be repeated here.

Figure 21:
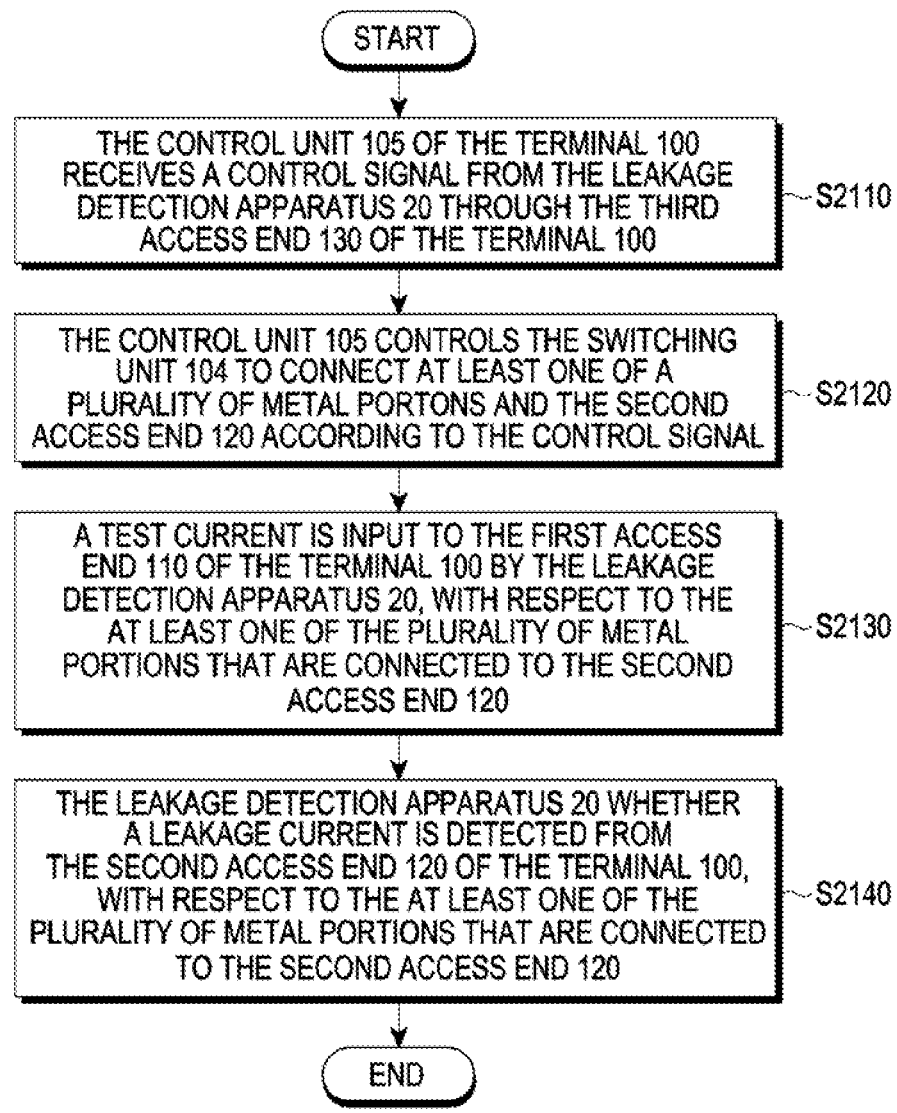

FIG. 21 illustrates a flowchart of a detection method for performing leakage detection for the terminal 100 supporting leakage detection according to another exemplary embodiment of the present invention, wherein the detection method may be performed by the terminal 100 described with reference to FIGS. 8 and 16. Since the connection relationship among the components in the terminal 100 in FIGS. 8 and 16 has been described above, the repeated description will not be repeated below.

In step S2110, the control unit 105 of the terminal 100 receives a control signal from the leakage detection apparatus 20 through the third access end 130 of the terminal 100.

In step S2120, the control unit 105 controls the switching unit 104 to connect at least one of the plurality of metal portions to the second access end 120 according to the control signal.

In step S2130, a test current is input to the first access end 110 of the terminal 100 by the leakage detection apparatus 20 with respect to the at least one of the plurality of metal portions that are connected to the second access end 120.

In step S2140, it is determined by the leakage detection apparatus 20 whether a leakage current is detected from the second access end 120 of the terminal 100 with respect to the at least one of the plurality of metal portions that are connected to the second access end 120.

For the at least one of the plurality of metal portions that are connected to the second access end 120, if the leakage detection apparatus 20 has determined that a leakage current is detected from the second access end 120 of the terminal 100, it is determined there is leakage between the ground line GND 14 of the terminal 100 and the at least one metal portion. If the leakage detection apparatus 20 has determined that a leakage current is not detected from the second access end 120 of the terminal 100, it may be determined that there is no leakage between the ground line GND 14 of the terminal 100 and the at least one metal portion.

In addition, after detecting whether there are leakage in all the metal portions, the control unit 105 may control the switching unit 104 to disconnect the second access end 120 from the last detected metal portion according to a control signal from the leakage detection apparatus 20, thereby the second access end 120 is suspended, and then preventing the terminal 100 from being mishandled by using the second access end 120.

Since the above process has been described in detail above with reference to FIGS. 8 and 16, the repeated description will not be repeated here.

It can be seen from the description of the present invention above with reference to FIGS. 1 to 21, in the terminal supporting the leakage detection and the detection method for performing the leakage detection for the terminal according to an exemplary embodiment of the present invention, after the metal terminal that has been covered and sprayed for aesthetics is fully assembled, no appearance damage is caused, and a test point is taken to the outside from the inside of the metal terminal through the internal design to perform the leakage test. Thereby, not only may the leakage safety of the metal terminal as a whole be ensured, but also it may be ensured that the appearance of the metal terminal after the color clovering and spraying will not be damaged or flaws will not be caused on the appearance of the metal terminal, and it may be convenient for the manufacturers to check the safety before delivery.

It should be noted that various steps described in the present application may be split into more steps according to a need of the implementation, or two or more steps or partial operations of the steps may be combined into a new step to achieve the object of the present invention.

The above method according to the present invention may be implemented in hardware, firmware, or as software or computer code that may be stored in a recording medium such as a CD ROM, a RAM, a floppy disk, a hard disk, or a magnetic optical disk, or may be implemented as computer code originally stored in a remote recording medium or non-transitory machine readable medium downloaded over a network and to be stored in a local recording medium, whereby the methods described here may be processed by such software stored in a recording medium using a general purpose computer, a dedicated processor, or programmable or dedicated hardware such as an ASIC or FPGA. It will be understood that a computer, processor, microprocessor controller or programmable hardware includes storage components (for example, RAM, ROM, Flash, etc.) that may store or receive software or computer code, the processing methods described here are implemented when the software or computer code is accessed and executed by a computer, processor or hardware. Moreover, when a general purpose computer accesses the code for implementing the processing shown here, the execution of the code converts the general purpose computer into a special purpose computer for performing the processing shown here.

While the present invention has been shown and described with reference to the preference embodiments, it will be understood by those skilled in the art that various modifications and changes in form and details may be made therein without departing from the spirit and scope of the present invention as defined by the claims.

The invention claimed is:

1. A terminal supporting leakage detection comprising:
a first conductive unit, a second conductive unit, a first access end, and a second access end,
wherein the first access end is configured to be connected to a ground line of a main board of the terminal through the first conductive unit and used to access a ground line of an external leakage detection apparatus,
the second access end is configured to be connected inside the terminal to a metal portion of an outer casing of the terminal through the second conductive unit, and used to access a line of the external leakage detection apparatus.

2. The terminal of claim 1, wherein the first access end and the second access end are pins of an external interface of the terminal.

3. The terminal of claim 1, wherein the first access end is a pin of an external interface of the terminal and the second access end is an access end that can be connected through an insertion hole of the terminal.

4. The terminal of claim 1, wherein the first conductive unit is a wire, and the second conductive unit comprises a wire, and a metal dome or a conductive foam,
wherein the second access end is connected to the metal portion by the metal dome or the conductive foam.

5. The terminal of claim 1, further comprising:
a switching unit configured to be connected to the second access end and the metal portion, and to connect the second access end and the metal portion or disconnect the second access end from the metal portion.

6. The terminal of claim 5, further comprising:
a third conductive unit; and
a third access end configured to be connected to the switching unit of the terminal through the third conductive unit, and used to access a control signal line of the external leakage detection apparatus,
wherein the switching unit connect the second access end and the metal portion or disconnect the second access end from the metal portion according to a control signal received from the third access end.

7. The terminal of claim 5, wherein when the metal portion includes a plurality of metal portions that are insulated and separated from each other, the switching unit connects at least one of the plurality of metal portions to the second access end according to a received control signal, so that the external leakage detection apparatus determines whether a leakage current is detected from the second access end of the terminal with respect to a specified metal portion of the plurality of metal portions.

8. The terminal of claim 6, further comprising:
a control unit connected to the switching unit and the third access end through the third conductive unit, and used to control the switching unit to connect the second access end and the metal portion or disconnect the second access end from the metal portion according to the control signal received from the external leakage detection apparatus through the third access end.

9. The terminal of claim 6, wherein the third conductive unit is a wire and the third access end is a pin of an external interface of the terminal.

10. A detection method for performing leakage detection for a terminal supporting leakage detection comprising:
inputting a test current to a first access end of the terminal by a leakage detection apparatus; and
determining whether a leakage current is detected from a second access end of the terminal, by the leakage detection apparatus,
wherein the first access end of the terminal is connected to a ground line of a main board of the terminal through a first conductive unit of the terminal and externally connected to a ground line of the leakage detection apparatus, and the second access end of the terminal is connected inside the terminal to a metal portion of an outer casing of the terminal through a second conductive unit of the terminal and externally connected to a line of the leakage detection apparatus.

11. The detection method of claim 10, wherein the first access end and the second access end are pins of an external interface of the terminal.

12. The detection method of claim 10, wherein the first access end is a pin of an external interface of the terminal, and the second access end is an access end that can be connected through an insertion hole of the terminal.

13. The detection method of claim 10, wherein the first conductive unit is a wire, and the second conductive unit comprises a wire and a metal dome or a conductive foam,
wherein the second access end is connected to the metal portion by the metal dome or the conductive foam.

14. The detection method of claim 10, further comprising:
connecting the second access end and the metal portion by a switching unit of the terminal,
wherein the switching unit is connected to the second access end and the metal portion.

15. The detection method of claim 14, the connecting the second access end and the metal portion by the switching unit of the terminal comprising:

connecting the second access end and the metal portion according to a control signal received from a third access end of the terminal, by the switching unit, wherein the third access end is connected to the switching unit through a third conductive unit and externally connected to a control signal line of the leakage detection apparatus.

16. The detection method of claim 14, wherein the connecting the second access end and the metal portion by the switching unit of the terminal comprising:

when the metal portion includes a plurality of metal portions that are insulated and separated from each other, connecting at least one of the plurality of metal portions to the second access end according to a received control signal by the switching unit, so that the leakage detection apparatus determines whether the leakage current is detected from the second access end of the terminal with respect to a specified metal portion of the plurality of metal portions.

17. The detection method of claim 15, wherein the connecting the second access end and the metal portion according to the control signal received from the third access end of the terminal, by the switching unit comprising:

receiving the control signal from the leakage detection apparatus by a control unit of the terminal through the third access end of the terminal; and controlling the switching unit to connect the second access end and the metal portion according to the received control signal by the control unit of the terminal, wherein the control unit is connected to the switching unit and the third access end by the third conductive unit.

18. The detection method of claim 15, wherein the third conductive unit is a wire, and the third access end is a pin of an external interface of the terminal.

* * * * *